(12) United States Patent
Kisic et al.

(10) Patent No.: US 8,206,186 B2
(45) Date of Patent: Jun. 26, 2012

(54) ELECTRICAL CONNECTOR ASSEMBLY, TEST LEAD ASSEMBLY THEREFOR, AND ASSOCIATED METHOD

(75) Inventors: James A. Kisic, Pittsburgh, PA (US); Samuel C. McCaslin, Pittsburgh, PA (US)

(73) Assignee: Westinghouse Electric Co. LLC, Cranberry Township, PA (US)

( * ) Notice: Subject to any disclaimer, the term of this patent is extended or adjusted under 35 U.S.C. 154(b) by 284 days.

(21) Appl. No.: 12/634,913

(22) Filed: Dec. 10, 2009

(65) Prior Publication Data

US 2011/0143578 A1  Jun. 16, 2011

(51) Int. Cl.
*H01R 11/18* (2006.01)
(52) U.S. Cl. ........................................ 439/709; 439/482
(58) Field of Classification Search .................. 439/482, 439/709, 711
See application file for complete search history.

(56) References Cited

U.S. PATENT DOCUMENTS

| | | | |
|---|---|---|---|
| 2,145,744 A * | 1/1939 | Whitney .................... | 174/152 R |
| 3,860,314 A * | 1/1975 | Vandiveer et al. ............. | 439/54 |
| 3,980,383 A * | 9/1976 | Dickey et al. ................. | 439/709 |
| 4,734,061 A * | 3/1988 | Randall et al. ................ | 439/709 |
| 5,069,636 A * | 12/1991 | Shimirak et al. .............. | 439/412 |
| 5,173,060 A | 12/1992 | Shimirak et al. | |
| 5,375,956 A | 12/1994 | Pennig | |
| 6,280,236 B1 | 8/2001 | Daoud | |
| 6,527,598 B1 | 3/2003 | Opel | |
| 6,630,626 B2 | 10/2003 | Johnson et al. | |
| 7,247,059 B2 * | 7/2007 | Greaves ........................ | 439/709 |
| 7,311,559 B1 | 12/2007 | Schlotterbeck et al. | |
| 7,438,603 B1 * | 10/2008 | Lewis ........................... | 439/709 |
| 7,485,132 B1 | 2/2009 | McBride | |
| 7,563,126 B2 | 7/2009 | Blanchot | |
| 7,837,517 B2 * | 11/2010 | Lewis ........................... | 439/709 |
| 7,955,141 B2 * | 6/2011 | Jang et al. ..................... | 439/709 |
| 2006/0003640 A1 * | 1/2006 | Fussell et al. ................. | 439/709 |
| 2011/0143578 A1 * | 6/2011 | Kisic et al. .................... | 439/482 |

FOREIGN PATENT DOCUMENTS

DE          3915998 A1      12/1990

\* cited by examiner

*Primary Examiner* — James Harvey

(57) ABSTRACT

A test lead assembly is provided for an electrical connector assembly, such as a terminal board. The terminal board includes a generally planar member and a number of fasteners, such as terminal screws, which are structured to fasten and electrically connect electrical conductors to the generally planar member. The test lead assembly includes an extension member having first and second opposing ends, and an intermediate portion extending therebetween. The first end is fastened to the enlarged head of a corresponding one of the terminal screws. A connection element is disposed at or about the second end of the extension member. In one embodiment the connection element is a thumb screw that electrically connects a test element to the extension member. The test lead assembly enables the terminal board to be tested, without loosening or otherwise disturbing the electrical connections of the terminal board. An associated method is also disclosed.

18 Claims, 4 Drawing Sheets

US 8,206,186 B2

ELECTRICAL CONNECTOR ASSEMBLY, TEST LEAD ASSEMBLY THEREFOR, AND ASSOCIATED METHOD

BACKGROUND

1. Field

The disclosed concept relates generally to electrical apparatus and, more particularly to electrical connector assemblies, such as terminal boards. The disclosed concept also relates to test lead assemblies. The disclosed concept further relates to methods of providing test lead assemblies for electrical connector assemblies.

2. Background Information

One non-limiting example of an electrical connector assembly is a terminal board. Terminal boards, which are sometimes referred to as terminal strips or terminal blocks, provide a convenient mechanism for connecting a plurality of electrical conductors (e.g., without limitation, wires; cables), thereby electrically connecting various associated electrical circuits, equipment and/or components.

In some applications, the conductors (e.g., without limitation, wires; cables) are secured to the terminal board directly, for example, by fastening a stripped portion of each wire beneath the enlarged head of a terminal screw or other suitable fastener which threadingly engages a corresponding hole in the terminal board. It is, however, also common for the electrical conductors (e.g., without limitation, wires; cables) to include an additional connecting element (e.g., without limitation, relatively flat loops and spades connected to the end of the wires and structured to fit neatly beneath the enlarged screw head; banana jacks; gator clips; BNC connectors) to facilitate attachment to the terminal board. Regardless of the manner in which the electrical connections are made, it is sometimes desired, or necessary, to test the integrity of the electrical connections.

Such testing typically involves connecting, disconnecting and moving a test lead, harness or other suitable testing element. Installing a test harness, for example, requires numerous terminal board screw locations to be loosened so that the wiring harness connector (e.g., without limitation, spade connector) can be inserted under each of the screw heads. The screws are then retightened. This process is labor-intensive and time-consuming, and can degrade the spade connectors and/or conductors (e.g., without limitation, wires; cables) over time. The process can also cause the threads of the terminal screws to seize up from frequent loosening and tightening, the heads of the screws can break off and/or a variety of other problems can ensue. The foregoing undesirably results in extensive downtime and costly repair work (e.g., without limitation, drilling out the remainder of the fractured screw; replacing the entire terminal board).

There is, therefore, room for improvement in electrical connector assemblies, such as terminal boards, and in test lead assemblies and associated methods therefor.

SUMMARY

These needs and others are met by embodiments of the disclosed concept, which are directed to a test lead assembly for electrical connector assemblies, such as terminal boards. Among other benefits, the test lead assembly maintains the integrity of the primary electrical connections of the terminal board by enabling them to be relatively quickly and easily tested, without requiring separate tools and without requiring the primary electrical connections to be loosened or otherwise altered or adjusted.

As one aspect of the disclosed concept, a test lead assembly is provided for an electrical connector assembly. The electrical connector assembly includes a generally planar member and a number of fasteners. Each of the fasteners is structured to fasten and electrically connect at least one electrical conductor to the generally planar member. The test lead assembly comprises: an extension member comprising a first end, a second end disposed opposite and distal from the first end, and an intermediate portion extending between the first end and the second end, the first end being structured to be fastened to a corresponding one of the fasteners; and a connection element disposed at or about the second end of the extension member, the connection element being structured to electrically connect a test element to the extension member. The extension member and the connection element are structured to enable the electrical connector assembly to be tested, without loosening or otherwise disturbing the electrical connections of the electrical connector assembly.

The electrical connector assembly may be a terminal board. The generally planar member of the terminal board may include a plurality of threaded apertures, and the number of fasteners may be a number of terminal screws each including an enlarged head and a threaded shank extending outwardly from the enlarged head. The threaded shank may be structured to threadingly engage a corresponding one of the threaded apertures. The enlarged head may include a plurality of threads, wherein the first end of the extension member is structured to engage the threads of the enlarged head.

The connection element may comprise an opening extending inwardly from the second end of the extension member. The connection element may further comprise a fastener, wherein the fastener is structured to be movably disposed within the opening. The fastener may include an enlarged head and a threaded shaft extending outwardly from the enlarged head, and the opening may be threaded, wherein the threaded shaft of the fastener is disposed in the threaded opening. The fastener may be movable between a first position corresponding to the fastener being loosened and the enlarged head of the fastener being disposed distal from the second end of the extension member, and a second position corresponding to the fastener being tightened and the enlarged head of the fastener being disposed proximate to the second end of the extension member. The fastener may be structured to move between the second position and the first position to fasten the test element to the extension member and to disconnect the test element from the extension member, respectively, without using a separate tool.

The extension member may further comprise a through hole, wherein the through hole extends from the first end of the extension member to the second end of the extension member. The through hole may have a first inside diameter at or about the first end of the extension member and a second inside diameter at or about the second end of the extension member, wherein the first inside diameter is greater than the second inside diameter. A portion of the through hole extending through the intermediate portion of the extension member may be unthreaded, and the threaded shaft of the fastener may include an end disposed within the unthreaded portion of the through hole. The end of the threaded shaft may be flared outwardly within the unthreaded portion of the through hole in order to resist undesired removal of the fastener from the extension member.

As another aspect of the disclosed concept, an electrical connector assembly comprises: a generally planar member; a number of electrical conductors; a number of fasteners each fastening and electrically connecting a corresponding one of the electrical conductors to the generally planar member to form a number of electrical connections; and at least one test lead assembly comprising: an extension member comprising a first end, a second end disposed opposite and distal from the first end, and an intermediate portion extending between the first end and the second end, the first end being fastened to a corresponding one of the fasteners, and a connection element disposed at or about the second end of the extension member, the connection element electrically connecting a test element to the extension member. The at least one test lead assembly enables the electrical connector assembly to be tested, without loosening or otherwise disturbing the electrical connections of the electrical connector assembly.

As a further aspect of the disclosed concept, a method of providing a test lead assembly for an electrical connector assembly is provided. The electrical connector assembly comprises a generally planar member and a number of fasteners. Each of the fasteners includes an enlarged head for fastening and electrically connecting at least one electrical conductor to the generally planar member to form an electrical connection. The method comprises: threading the enlarged head of at least one of the fasteners to include a plurality of threads; fastening a first end of an extension member to the threads of the enlarged head; and movably coupling a connection element to a second end of the extension member.

The method may further comprise electrically connecting a test element to the extension member using the connection element, and testing the electrical connector assembly, without loosening or otherwise disturbing the electrical connections of the electrical connector assembly and without using a separate tool.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
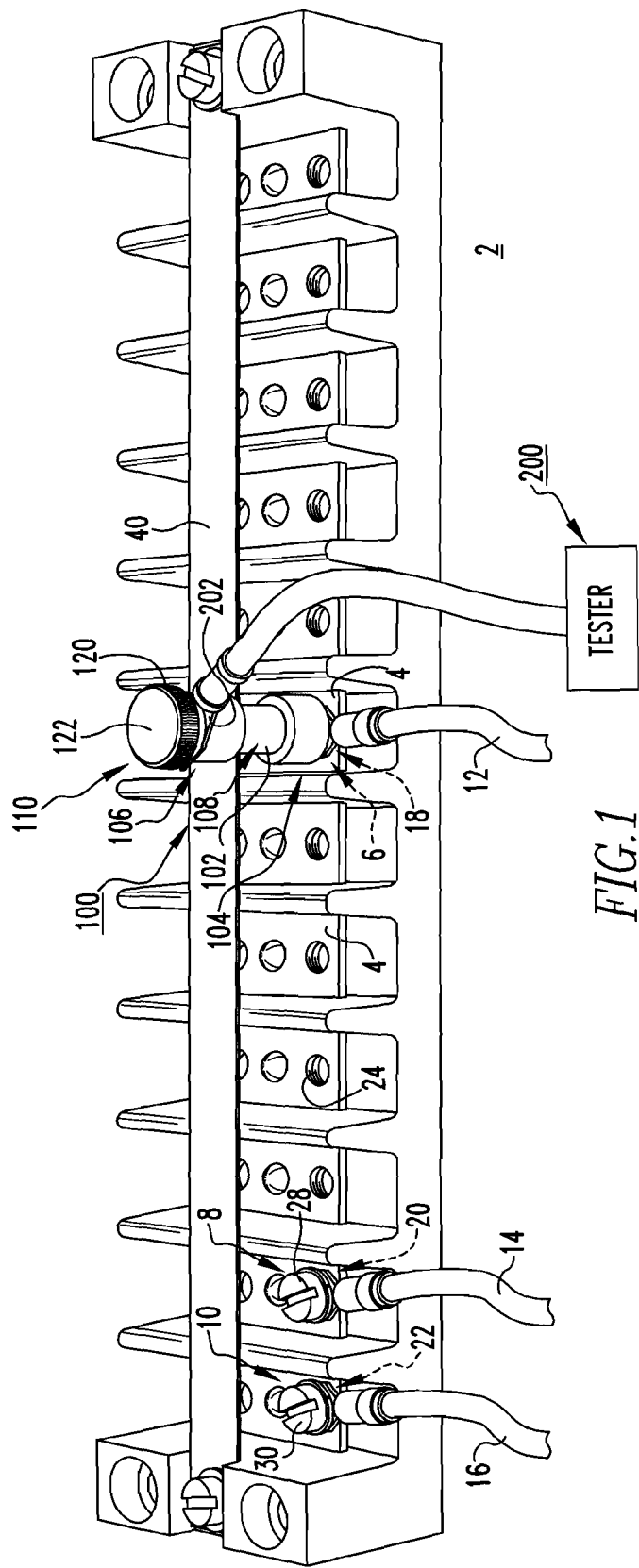
FIG. 1 is an isometric view of a terminal board and a test lead assembly therefor, in accordance with an embodiment of the disclosed concept.

Directional phrases used herein, such as, for example, clockwise, counterclockwise, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

FIG. 1 shows a test lead assembly 100 for an electrical connector assembly such as, for example and without limitation, the terminal board 2, which is shown. The terminal board 2 includes an electrically conductive generally planar member 4. It will be appreciated that the generally planar member 4 may be divided into segments separated by electrically isolative barriers or separators, as shown for example in FIG. 4. A number of fasteners 6 (e.g., without limitation, terminal screws) (hidden in FIGS. 1-3, but see FIGS. 4 and 5), 8,10 (all shown in FIG. 1) are structured to fasten and electrically connect a number of corresponding electrical conductors 12,14,16 (partially shown in FIG. 1) (e.g., without limitation, wires; cables), respectively, to a corresponding segment of a generally planar member 4. Thus, the terminal board 2 provides a mechanism for conveniently forming a number of electrical connections, in a generally well known manner.

Each of the disclosed test lead assemblies 100 (see also test lead assembly 100' of FIG. 3) is structured to cooperate with a corresponding one of the terminal screws 6 to enable the terminal board 2 and, in particular, the electrical connections thereof, to be tested relatively quickly and easily and without requiring the primary electrical connection between the electrical conductor (e.g., without limitation, wire 12) and generally planar member 4 of the terminal board 2 to be loosened or otherwise disturbed. Accordingly, among other advantages, the integrity of the primary electrical connections is not compromised. As will be discussed hereinbelow, the disclosed test lead assembly consequently results in less downtime being required to test the terminal board 2 or other electrical connector assembly (not shown). It is also safer than prior art test component assemblies, it virtually eliminates wear and tear on the terminal board electrical connections, and it does not require the use of any separate tools (e.g., without limitation, hand tools, such as wrenches or screwdrivers).

Figure 3:
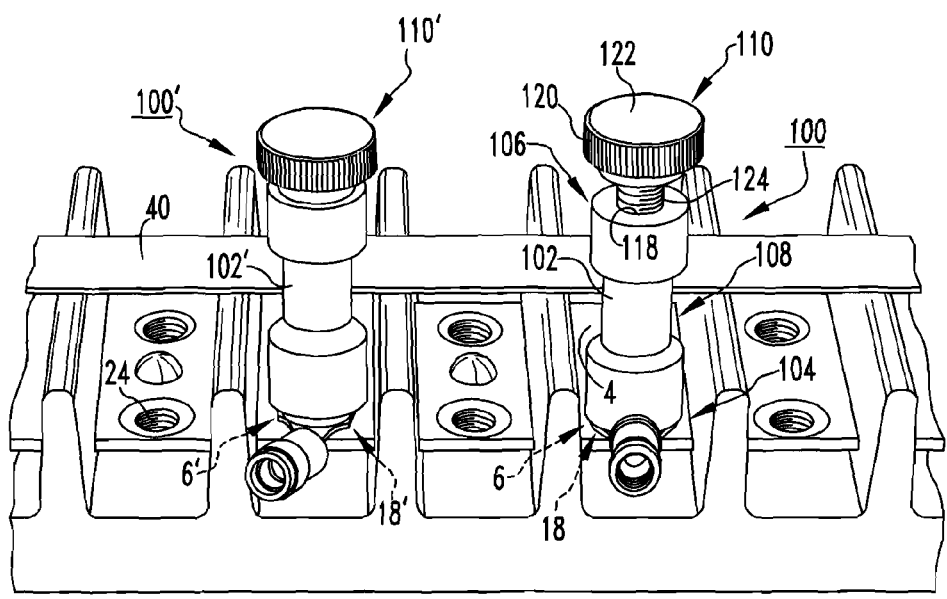
FIG. 3 is an isometric view of the portion of the terminal board of FIG. 2, showing two test lead assemblies.

For economy of disclosure, only one test lead assembly 100 will be described herein, in detail. It will, however, be appreciated that test lead assembly 100', which is shown for example in FIG. 3, is substantially similar in structure. It will further be appreciated that any known or suitable alternative number and/or configuration of test lead assemblies (not shown) could be employed with any known or suitable alternative electrical connector assembly (not shown), without departing from the scope of the disclosed concept.

Figure 4:
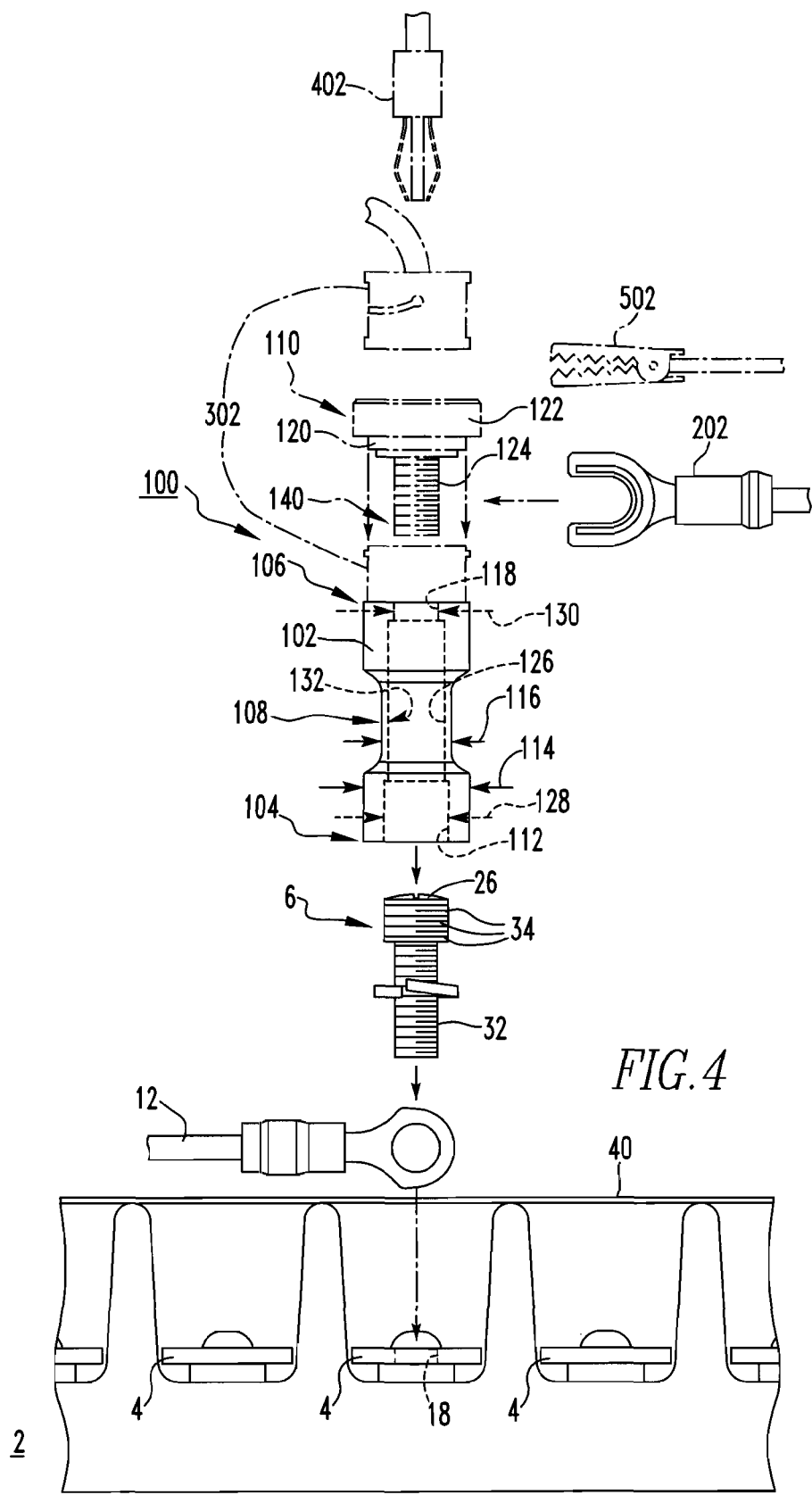
FIG. 4 is a partially exploded side elevation view of one of the test lead assemblies of FIG. 3, also showing non-limiting alternative connecting elements in accordance with alternative embodiments of the disclosed concept.
Figure 5:
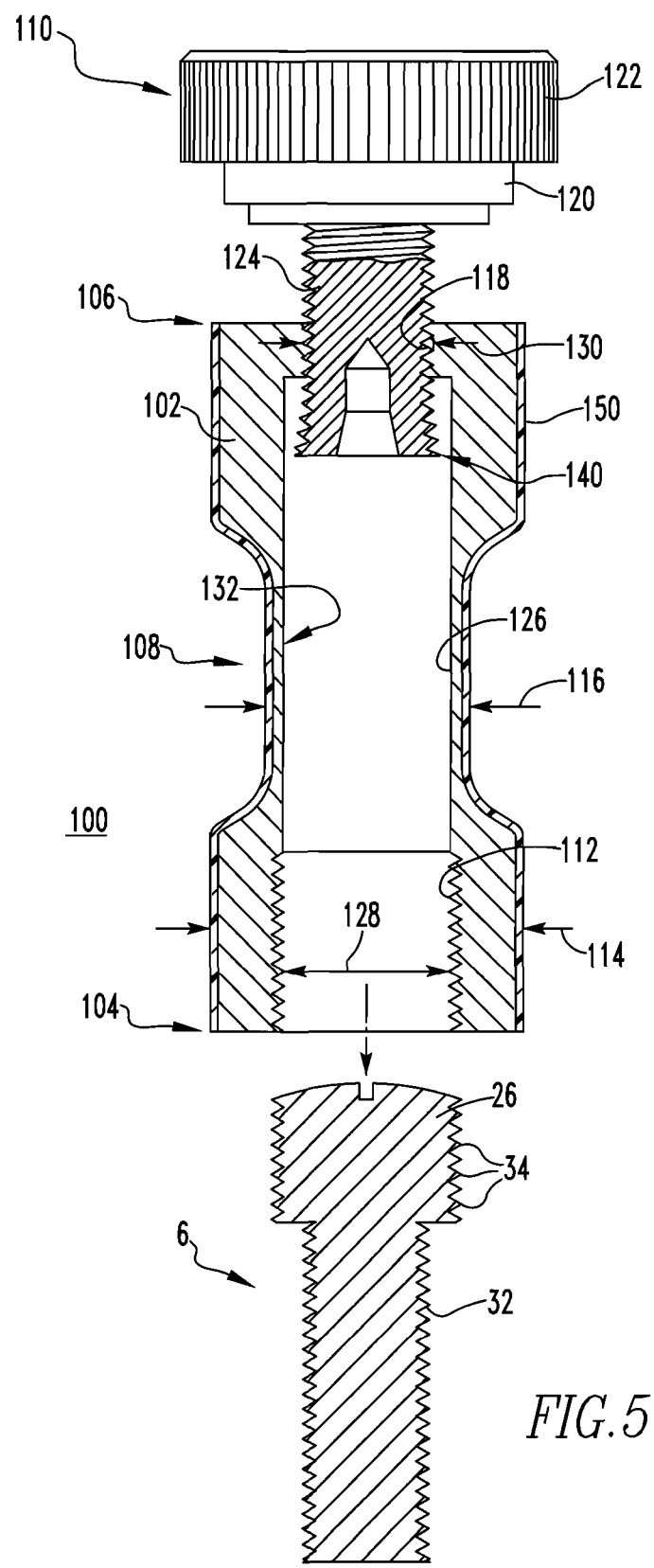
FIG. 5 is a section view of a portion of the test lead assembly of FIG. 4.

The test lead assembly 100 shown in the non-limiting example of FIGS. 1-5 (see also test lead assembly 100' of FIG. 3), includes an extension member 102 having first and second opposing ends 104,106 and an intermediate portion 108 extending therebetween. The first end 104 is structured to be fastened to a corresponding one of the aforementioned fasteners (e.g., without limitation, terminal screw 6 (hidden in FIGS. 1-3, but see FIGS. 4 and 5)). More specifically, as shown in FIGS. 4 and 5, the terminal screw 6 includes an enlarged head 26 and a threaded shank 32, which extends outwardly from the enlarge head 26. The threaded shank 32 threadingly engages a corresponding threaded aperture 18 (FIG. 4) of a corresponding segment of the generally planar member 4 of the terminal board 2. The other terminal screws 8,10 shown in the example of FIG. 1, likewise include enlarged heads 28,30, respectively, and threadingly engage corresponding threaded apertures 20,22 (hidden in FIG. 1, but see, for example, threaded aperture 24).

In accordance with one non-limiting embodiment of the disclosed concept, the enlarged head 26 of the terminal screw 6 is threaded to include a plurality of threads 34 (FIGS. 4 and 5), and the first end 104 of the exemplary extension member 102 includes a correspondingly threaded bore 112. Thus, the threaded bore 112 threadingly engages the threads 34 of the enlarged head 26 of the corresponding terminal screw 6, thereby fastening and electrically connecting the extension member 102 to the terminal screw 6. As previously noted, this can advantageously be accomplished without requiring the use of a separate tool.

The extension member 102 can be made from any known or suitable electrically conductive material (e.g., without limitation, copper) and may include an electrical insulator 150. In the example of FIG. 5, the electrical insulator 150 overlays or coats the electrically conductive material. It will be appreciated that any known or suitable type and/or configuration (not shown) of material could be used for the extension member 102 and/or electrical insulator 150. For example and without limitation, the electrical insulator 150 could comprise a rubber coating that serves to insulate the extension member 102, and the test lead assembly 100 generally, from adjacent structures or electrical connections of the terminal board 2. In this manner, the disclosed concept also provides a safe mechanism and associated method of testing electrical connections.

The second end 106 of the extension member 102 includes a connection element 110, which is structured to electrically connect any known or suitable test element 200 (shown in simplified form in FIG. 1) to the extension member 102, to test a corresponding electrical connection of the terminal board 2, as previously discussed. More specifically, an opening 118 extends inwardly from the second end 106 of the extension member 102, as best shown in hidden line drawing in FIG. 4, and in the sectional view of FIG. 5. It will be appreciated that, in accordance with certain non-limiting embodiments of the disclosed concept, such opening 118 may be configured to receive and form an electrical connection with any known or suitable electrical connector (see, for example and without limitation, the BNC connector assembly 302, banana-jack connector 402, or gator clip connector 502, all shown in phantom line drawing in FIG. 4). Accordingly, in such circumstances, the opening 118 can by itself effectively function as the connection element 110 for electrically connecting the test element 200 (shown in simplified form in FIG. 1) to the extension member 102 and, in turn, to the terminal board 2 by way of the electrical connector (e.g., without limitation, BNC connector assembly 302; banana-jack connector 402; gator clip connector 502).

Preferably, however, the connection element 110 further comprises a fastener such as, for example and without limitation, the thumb screw 120, shown in FIGS. 1-3 and 5 in solid line drawing, and in FIG. 4 in phantom line drawing (representing an alternative to one of the aforementioned electrical connectors 302,402,502). The thumb screw 120, or other suitable fastener (not shown), is structured to be movably disposed within the aforementioned opening 118 of the extension member 102. More specifically, the thumb screw 120 includes an enlarged head 122 and a threaded shaft 124 (FIGS. 4 and 5) extending outwardly from the enlarged head 122 and threadingly cooperating with the extension member opening 118, which is also threaded. It will, therefore, be appreciated that the thumb screw 120 is movable between a first position (FIGS. 3 and 5) corresponding to the thumb screw 120 being loosened and the enlarged head 122 being disposed distal from the second end 106 of the extension member 102, and a second position (FIGS. 1 and 2) corresponding to the thumb screw 120 being tightened and the enlarged head 122 being disposed proximate to the second end 106 of the extension member 102 so as to fasten a corresponding connector 202 (FIGS. 1 and 4) between the enlarged head 122 and the second end 106 of the extension member 102, as shown in FIG. 1. In other words, the thumb screw 120 can be relatively quickly and easily moved between the first position (FIGS. 3 and 5) to the second position (FIGS. 1 and 2) to fasten and disconnect, respectively, the test element 200 (shown in simplified form in FIG. 1) to the extension member, without requiring the use of any separate tool.

It will be appreciated that the spade connector 202 and the hoop or ring connector (not numbered) of wire 12 are purposely shown in the incorrect orientation (i.e., vertical rather than horizontal) in order to clearly illustrate their structure.

Figure 2:
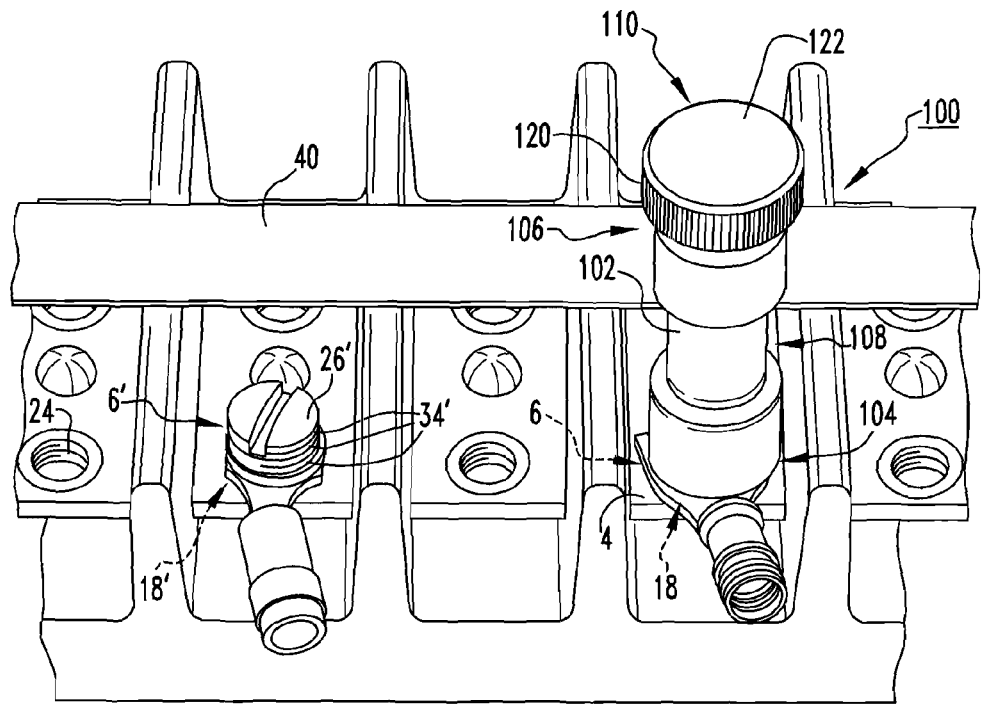
FIG. 2 is an isometric view of a portion of the terminal board and test lead assembly therefor of FIG. 1, also showing an additional terminal connection with the test lead assembly therefor removed.

In the example shown and described herein, the intermediate portion 108 of the extension member 102 tapers inwardly. That is, the first end 104 of the extension member 102 has a first outside diameter 114, which is greater than the second outside diameter 116 of the intermediate portion 108, as shown in FIGS. 4 and 5. This enables the extension member 102 to be installed adjacent to the elongated terminal numbering strip 40, which is included on some terminal boards 2, as shown, for example, in FIGS. 1-4. More specifically, when the extension member 102 is fastened and electrically connected to the enlarged head 26 (FIGS. 4 and 5) of the corresponding terminal screw 6, the extension member 102 extends perpendicularly outwardly from the planar member 4, and the second outside diameter of the intermediate portion 108 of the extension member 102 is disposed adjacent to, so as to accommodate, the terminal number strip 40, as shown in FIGS. 1-3. It will, however, be appreciated that the extension member 102 could have any known or suitable shape, size and/or configuration, other than that which is shown and described herein, without departing from the scope of the disclosed concept. For example, the extension member 102 could have any known or suitable length, and the intermediate portion 108 could be straight rather than tapered.

As shown in FIG. 5, the exemplary extension member 102 further includes a through hole 126 extending from the first end 104 of the extension member 102 to the second end 106 thereof. The through hole 126 has a first inside diameter 128, at or about the first end 104 of the extension member 102, and a second inside diameter 130, at or about the second end 106. The first inside diameter 128 is greater than the second inside diameter 130, as shown. The through hole 126 includes the aforementioned threaded bore 112 at the first end 104 of the extension member 102, and the threaded opening 118 at the second end 106 of the extension member 102. However, a portion 132 of the through hole 126, which extends through the intermediate portion 108 of the extension member 102, is substantially smooth or unthreaded, as shown. Preferably, the threaded shaft 124 of the fastener (e.g., without limitation, thumb screw 108) includes an end 140, which is disposed within the unthreaded portion 132 of the through hole 126, and is flared outwardly within the unthreaded portion 132, as shown. For example and without limitation, this may be accomplished by drilling the end 140 of the threaded shaft 124 of the thumb screw 120, after it has been inserted into the unthreaded portion 132 of the through hole 126, causing it to flare radially outwardly. In this manner, the flared end 140 of the thumb screw 120 advantageously resists undesired removal of the thumb screw 120 from the extension member 102 while still enabling it to be loosened (FIGS. 3 and 5) and tightened (FIGS. 1 and 2), as desired.

Accordingly, it will be appreciated that, in accordance with an associated method of providing and employing the aforementioned test lead assembly 100 for testing an electrical connector assembly, such as the aforementioned terminal board 2, the following steps are preferably involved: threading the enlarged head 26 of at least one of the terminal screws 6 to include a plurality of threads 34, as best shown in FIGS. 4 and 5; fastening the first end 104 of the extension member 102 to the threads 34 of the enlarged head 26; and coupling connection element 110 to the second end 106 of the extension member 102. To test the electrical connections of the electrical connector assembly (e.g., without limitation, terminal board 2) any known or suitable test element 200 (indicated generally in simplified form as "tester" in FIG. 1) can be quickly and easily connected to the extension member 102 using the connection element 110, as previously discussed (see also connectors 202,302,402,502 of FIG. 4). Accordingly, as previously discussed, the terminal board 2 and in particular, the electrical connections thereof, can be tested without loosening or otherwise disturbing the electrical connections, so as to ensure the integrity of the electrical connections is preserved, and without requiring the use of a separate tool (not shown). As also previously discussed, preferably, the connection element 110 is a thumb screw 120, wherein the method further includes the step of inserting the end 140 of the thumb screw 120 into the substantially smooth (e.g., unthreaded) portion 132 of the through hole 126 of the extension member 102, and flaring the end 140 of the thumb screw 120 within the unthreaded portion 132 of the through hole 126 to resist undesired removal of the thumb screw 120 from the extension member 102.

Accordingly, the disclosed test lead assembly 100 provides a relatively quick and easy mechanism for facilitating periodic testing of the electrical connections of an electrical connector assembly (e.g., without limitation, terminal board 2), without requiring the electrical connections to be loosened and retightened, or otherwise disturbed, and without requiring the use of any separate tools. In this manner, the disclosed concept greatly simplifies and expedites the testing process, which advantageously reduces the amount of downtime required to perform such tests.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A test lead assembly for an electrical connector assembly, said electrical connector assembly including a generally planar member and a number of fasteners, each of said fasteners being structured to fasten and electrically connect at least one electrical conductor to said generally planar member, said test lead assembly comprising:
    an extension member comprising a first end, a second end disposed opposite and distal from the first end, and an intermediate portion extending between the first end and the second end, the first end being structured to be fastened and electrically connect the second end to a corresponding one of said fasteners; and
    a connection element disposed at or about the second end of said extension member, said connection element being structured to electrically connect a test element to said extension member,
    wherein said extension member and said connection element are structured to enable said electrical connector assembly to be tested, without loosening or otherwise disturbing the electrical connections of said electrical connector assembly,
    wherein said number of fasteners is a number of terminal screws each including an enlarged head and a threaded shank extending outwardly from said enlarged head,
    wherein said enlarged head includes a plurality of threads,
    wherein the first end of said extension member includes a threaded bore, and
    wherein said threaded bore is structured to threadingly engage the threads of said enlarged head, in order to fasten and electrically connect said extension member to said enlarged head, without using a separate tool.

2. The test lead assembly of claim 1 wherein said electrical connector assembly is a terminal board; wherein said generally planar member of said terminal board includes a plurality of threaded apertures; and wherein said threaded shank is structured to threadingly engage a corresponding one of said threaded apertures.

3. A method of providing a test lead assembly for an electrical connector assembly, said electrical connector assembly comprising a generally planar member and a number of fasteners, each of said fasteners including an enlarged head for fastening and electrically connecting at least one electrical conductor to said generally planar member to form an electrical connection, the method comprising:
    threading the enlarged head of at least one of said fasteners to include a plurality of threads;
    fastening a first end of an extension member to the threads of said enlarged head;
    movably coupling a connection element to a second end of the extension member;
    electrically connecting a test element to said extension member using said connection element, and
    testing said electrical connector assembly, without loosening or otherwise disturbing the electrical connections of said electrical connector assembly and without using a separate tool.

4. The test lead assembly of claim 2 wherein the first end of said extension member has a first outside diameter; wherein the intermediate portion of said extension member has a second outside diameter; and wherein the second outside diameter of the intermediate portion is smaller than the first outside diameter of the first end.

5. The test lead assembly of claim 1 wherein said connection element comprises an opening extending inwardly from the second end of said extension member.

6. The test lead assembly of claim 5 wherein said connection element further comprises a fastener; and wherein said fastener is structured to be movably disposed within said opening.

7. The test lead assembly of claim 6 wherein said fastener includes an enlarged head and a threaded shaft extending outwardly from said enlarged head; wherein said opening is threaded; wherein said threaded shaft of said fastener is disposed in said threaded opening; wherein said fastener is movable between a first position corresponding to said fastener being loosened and said enlarged head of said fastener being disposed distal from the second end of said extension member, and a second position corresponding to said fastener being tightened and said enlarged head of said fastener being disposed proximate to the second end of said extension member; and wherein said fastener is structured to move between said second position and said first position to fasten said test element to said extension member and to disconnect said test element from said extension member, respectively, without using a separate tool.

8. The test lead assembly of claim 7 wherein said extension member further comprises a through hole; wherein said through hole extends from the first end of said extension member to the second end of said extension member; wherein said through hole has a first inside diameter at or about the first end of said extension member; wherein said through hole has a second inside diameter at or about the second end of said extension member; and wherein the first inside diameter is greater than the second inside diameter.

9. The test lead assembly of claim 8 wherein a portion of said through hole extending through the intermediate portion of said extension member is unthreaded; wherein said threaded shaft of said fastener includes an end; wherein the end of said threaded shaft is disposed within said unthreaded portion of said through hole; and wherein the end of said threaded shaft is flared outwardly within said unthreaded portion of said through hole in order to resist undesired removal of said fastener from said extension member.

10. The test lead assembly of claim 1 wherein said extension member is made from an electrically conductive material; and wherein said extension member further an electrical insulator overlaying said electrically conductive material.

11. An electrical connector assembly comprising:
   a generally planar member;
   a number of electrical conductors;
   a number of fasteners each fastening and electrically connecting a corresponding one of said electrical conductors to said generally planar member to form a number of electrical connections; and
   at least one test lead assembly comprising:
      an extension member comprising a first end, a second end disposed opposite and distal from the first end, and an intermediate portion extending between the first end and the second end, the first end being fastened and electrically connect the second end to a corresponding one of said fasteners, and
      a connection element disposed at or about the second end of said extension member, said connection element electrically connecting a test element to said extension member,
      wherein said at least one test lead assembly enables said electrical connector assembly to be tested, without loosening or otherwise disturbing the electrical connections of said electrical connector assembly,
      wherein said number of fasteners is a number of terminal screws each including an enlarged head and a threaded shank extending outwardly from said enlarged head,
      wherein said enlarged head includes a plurality of threads,
      wherein the first end of said extension member of said at least one test lead assembly includes a threaded bore, and
      wherein said threaded bore is structured to threadingly engage the threads of said enlarged head, in order to fasten and electrically connect said extension member to said enlarged head, without using a separate tool.

12. The electrical connector assembly of claim 11 wherein said electrical connector assembly is a terminal board; wherein said generally planar member of said terminal board includes a plurality of threaded apertures; and wherein said threaded shank threadingly engages a corresponding one of said threaded apertures.

13. The electrical connector assembly of claim 12 wherein said terminal board includes an elongated terminal numbering strip; wherein the first end of said extension member of said at least one test lead assembly has a first outside diameter; wherein the intermediate portion of said extension member has a second outside diameter; wherein the second outside diameter of the intermediate portion is smaller than the first outside diameter of the first end; and wherein, when said extension member is fastened and electrically connected to the enlarged head of said corresponding one of said terminal screws, said extension member extends perpendicularly outwardly from said generally planar member with the second outside diameter of the intermediate portion of said extension member being disposed adjacent to said numbering strip.

14. The electrical connector assembly of claim 11 wherein said connection element of said extension member of said at least one test lead assembly comprises an opening extending inwardly from the second end of said extension member.

15. The electrical connector assembly of claim 14 wherein said connection element further comprises a fastener; wherein said fastener includes an enlarged head and a threaded shaft extending outwardly from said enlarged head; wherein said opening is threaded; wherein said threaded shaft of said fastener is disposed in said threaded opening; wherein said fastener is movable between a first position corresponding to said fastener being loosened and said enlarged head of said fastener being disposed distal from the second end of said extension member, and a second position corresponding to said fastener being tightened and said enlarged head of said fastener being disposed proximate to the second end of said extension member; and wherein said fastener moves between said second position and said first position to fasten said test element to said extension member and to disconnect said test element from said extension member, respectively, without using a separate tool.

16. The electrical connector assembly of claim 15 wherein said extension member further comprises a through hole; wherein said through hole extends from the first end of said extension member to the second end of said extension member; wherein said through hole has a first inside diameter at or about the first end of said extension member; wherein said through hole has a second inside diameter at or about the second end of said extension member; and wherein the first inside diameter is greater than the second inside diameter.

17. The electrical connector assembly of claim 16 wherein a portion of said through hole extending through the intermediate portion of said extension member is unthreaded; wherein said threaded shaft of said fastener includes an end; wherein the end of said threaded shaft of said fastener is disposed within said unthreaded portion of said through hole; and wherein the end of said threaded shaft is flared outwardly within said unthreaded portion of said through hole in order to resist undesired removal of said fastener from said extension member.

18. The method of claim 3, further comprising:
   the connection element comprising a fastener including an end,
   inserting the end of said fastener into a substantially smooth portion of a through hole of said extension member, and
   flaring the end of said fastener within said substantially smooth portion of said through hole in order to resist undesired removal of said fastener from the extension member.

* * * * *